United States Patent [19]

Uema

[11] 4,413,186
[45] Nov. 1, 1983

[54] METHOD FOR DETECTING A POSITION OF A MICRO-MARK ON A SUBSTRATE BY USING AN ELECTRON BEAM

[75] Inventor: Kenyu Uema, Yokohama, Japan
[73] Assignee: Fujitsu Limited, Kawasaki, Japan
[21] Appl. No.: 180,946
[22] Filed: Aug. 25, 1980
[30] Foreign Application Priority Data

Aug. 29, 1979 [JP] Japan .............................. 54-109894

[51] Int. Cl.³ .............................................. H01J 37/00
[52] U.S. Cl. ............................. 250/491.1; 250/492.2
[58] Field of Search ................... 250/491, 492.1, 492.2, 250/492.3, 398, 397, 396 R; 219/121 EX, 121 EW, 121 EY, 121 EU, 121 EV

[56] References Cited

U.S. PATENT DOCUMENTS

| | | | |
|---|---|---|---|
| 3,783,228 | 1/1974 | Tarui et al. | 250/492.2 |
| 3,864,597 | 2/1975 | Trotel | 250/492.2 |
| 3,875,414 | 4/1975 | Prior | 250/492.2 |
| 4,357,540 | 11/1982 | Benjamin et al. | 250/491.1 |
| 4,365,163 | 12/1982 | Davis et al. | 250/491.1 |

Primary Examiner—Alfred E. Smith
Assistant Examiner—Carolyn E. Field
Attorney, Agent, or Firm—Staas & Halsey

[57] ABSTRACT

A method for detecting a position of a micro-mark on a substrate by detecting reflected electrons or secondary electrons radiated from said substrate which is scanned by an electron beam. A pilot mark which has a predetermined relative position with respect to the micro-mark and which is larger than the micro-mark is provided in a range where the electron beam is scanned. First, the pilot mark is scanned by the electron beam and the position of the pilot mark is read out, then, the position of the micro-mark is determined by the read out position of the pilot mark which has a predetermined relative position with respect to the micro-mark.

12 Claims, 19 Drawing Figures

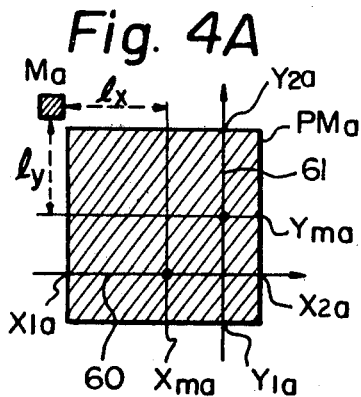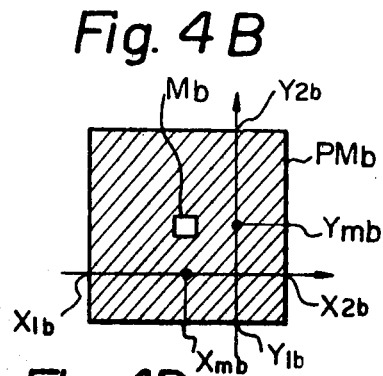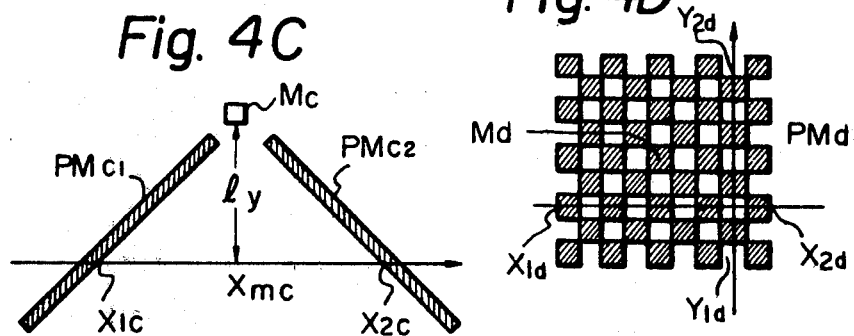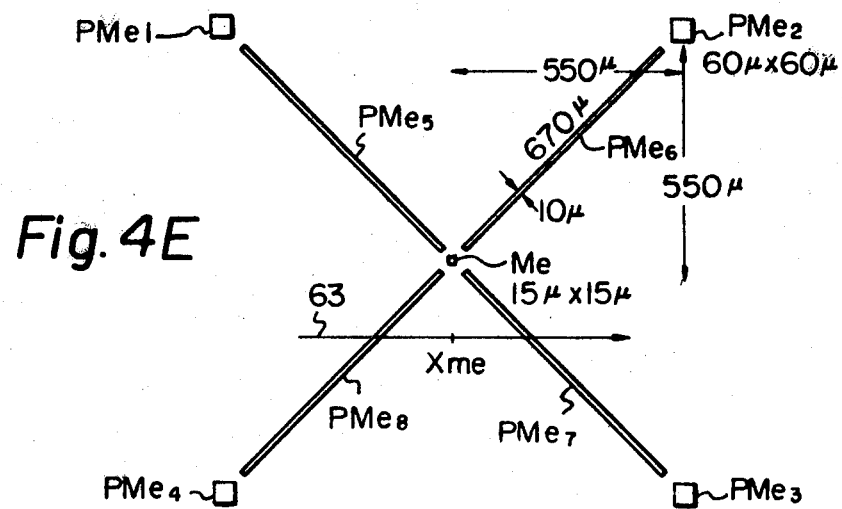

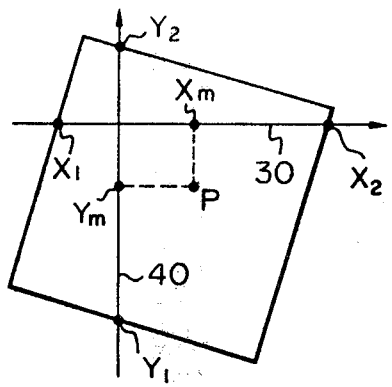
Fig. 5
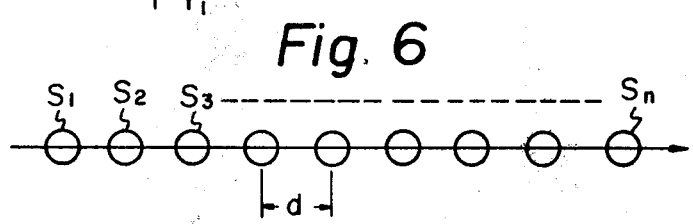
Fig. 6
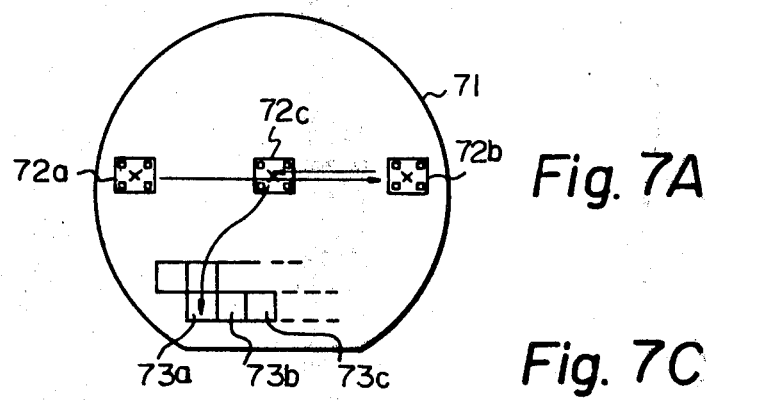
Fig. 7A
Fig. 7C
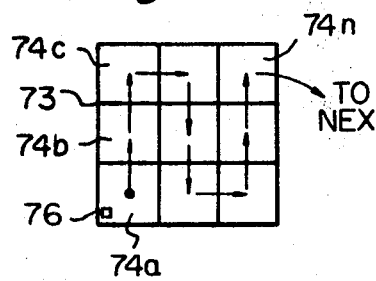
Fig. 7B

METHOD FOR DETECTING A POSITION OF A MICRO-MARK ON A SUBSTRATE BY USING AN ELECTRON BEAM

BACKGROUND OF THE INVENTION

The present invention relates to a method for detecting a position of a micro-mark on a substrate by using an electron beam, and more especially to a method which can be effectively used when a pattern for a semiconductor integrated circuit such as an IC (integrated circuit) or LSI (large scale integrated circuit) is formed on a semiconductor substrate by an electron beam exposing apparatus which emits an electron beam.

The detection of the position of a micro-mark is conventionally carried out during an electron beam exposure process of an electron beam sensitive resist deposited on a wafer for forming a pattern when the semiconductor integrated circuit is manufactured.

In a process of forming a pattern: before the process of forming a pattern, a wafer is positioned on a holder, the holder is mounted on a stage and the stage is fixed in a main chamber. When the stage is fixed in the main chamber, positioning error of the wafer is caused by errors of the shapes of the wafer and the holder or by errors caused by mechanical inaccuracy of the apparatus for introducing the holder into the main chamber. Therefore, a magnification factor or a reduction factor of the pattern and the position of a focus point of the electron beam is adjusted by detecting the position of a micro-mark formed on the wafer.

Conventionally, this detection of the micro-mark was carried out in the following manner. Before the process of forming a pattern, the electron beam scans with a relatively large pitch the predetermined region where the micro-mark is included. When the electron beam passes over the micro-mark, the variation of the secondary electrons is detected by a secondary electron multiplier, and this variation forms a corresponding pattern on a display apparatus which is externally provided. Then, an operator manually positions the stage, by observing the position of the micro-mark on a display screen or panel so as to place the micro-mark image on the display screen or panel at the center of the display screen, preliminary to the succeeding operations for precisely detecting the position of the micro-mark and then compensating the positioning errors.

As mentioned above, in the conventional method for detecting a micro-mark, a display device is used and the operation is performed by an operator. If the whole scanning area is scanned by an electron beam with a minute pitch to precisely detect the position of the micro-mark which assures the precise position compensation, much more time will be required to finish the scanning operation because a slow scan must be carried out with a sharp electron beam over the whole scanning area to obtain the necessary precision. Therefore, much time is required for detecting the position of the micro-mark in the conventional method.

SUMMARY OF THE INVENTION

One object of the present invention is to provide a method for detecting the position of a micro-mark without the time-consuming inconvenience of the conventional method.

Another object of the present invention is to provide a method for rapidly detecting the micro-mark on the substrate.

A further object of the present invention is to provide a method for automatically detecting the position of the micro-mark on the substrate. A still further object of the present invention is to provide a method for precisely detecting the position of a micro-mark on a substrate.

The above-mentioned objects can be achieved by a method for detecting a position of a micro-mark on a substrate by detecting reflected electrons or secondary electrons radiated from the substrate which is scanned by an electron beam comprising the steps of: providing, in a first range where the electron beam is scanned, a pilot mark which has a predetermined relative position with respect to the micro-mark and which is larger than the micro-mark; scanning the pilot mark by the electron beam so as to detect the position of the pilot mark; determining the relative position of the position of the pilot mark with respect to the micro-mark so that the position of the micro-mark is determined; and scanning the micro-mark by the electron beam so as to detect the precise position of the micro-mark.

Further features and advantages of the present invention will be apparent from the ensuing description with reference to the accompanying drawings to which, however, the scope of the invention is in no way limited.

BRIEF DESCRIPTION OF THE DRAWINGS

FIGS. 4A, 4B, 4C, 4D and 4E illustrate examples of pilot marks according to the present invention;

FIGS. 5 and 6 are diagrams illustrating an error of a pilot mark and a scanning mode of an electron beam on the scanning line; and FIGS. 7A, 7B and 7C illustrate a wafer which uses a pilot mark according to the present invention.

DETAILED DESCRIPTION OF THE INVENTION

Figure 1:
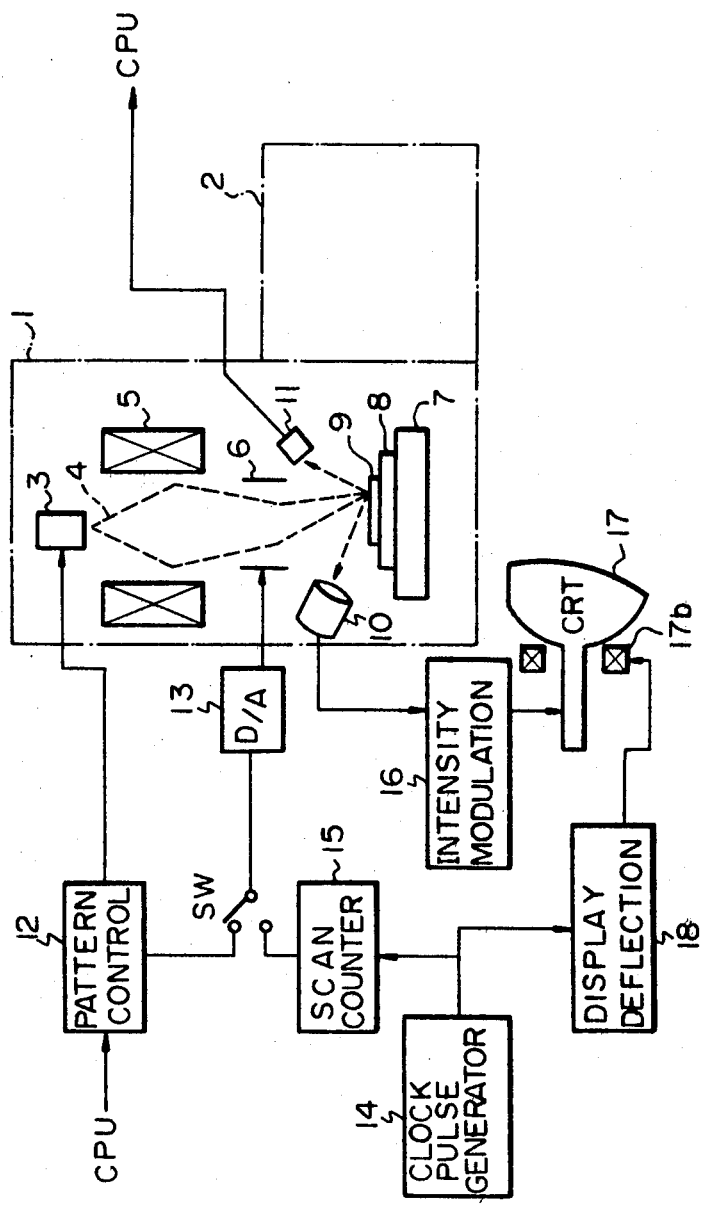
FIGS. 1, 2A and 2B illustrate portions of an apparatus and a wafer according to the conventional method for detecting the position of the wafer.
Figure 2A:
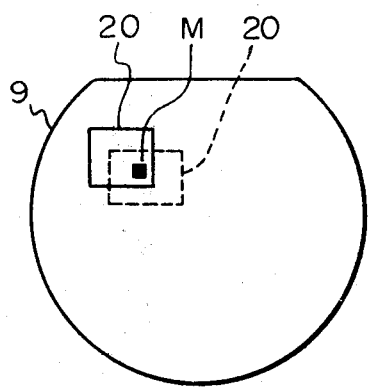
Figure 2B:
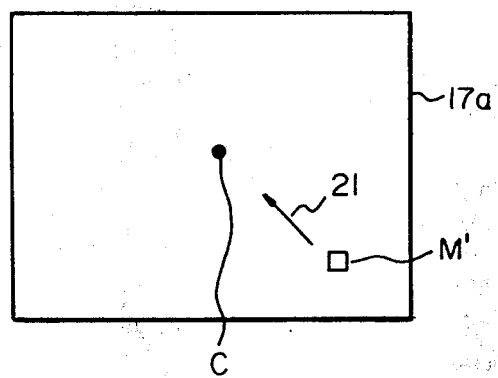

FIG. 1 illustrates one example of a construction of an apparatus according to a conventional method for detecting a micro-mark on a substrate. FIGS. 2A and 2B respectively illustrate a wafer on which a micro-mark is provided, and the screen or panel of a display device for detecting the position of the micro-mark.

Referring to FIG. 1, 1 denotes a vacuum chamber (a main chamber) where an electron beam exposure apparatus is housed, 2 denotes another vacuum chamber (a sub-chamber) where the wafer is temporarily housed before introducing the wafer into the main chamber or after removing the wafer from the main chamber, 3 denotes an electron gun, 4 denotes an electron beam, 5 denotes an electron lens for focusing the electron beam 4 radiated from the electron gun 3, 6 denotes deflection plates, 8 denotes a holder, 9 denotes a wafer, 7 denotes a stage for mounting the wafer 9 fixed on the holder 8, 10 denotes a secondary electron multiplier, and 11 denotes a detector for detecting reflected electrons. A pattern control circuit 12 controls the radiation and the interruption or blanking of the electron beam 4 from the electron gun 3, and generates an indicating value for the deflection voltage to be supplied to the deflection plate 6, under the command signal supplied from a central processing unit CPU. A digital to analog converter 13 receives, via a switch SW, the indicated value for the deflection voltage, generated from the control circuit 12, in order to convert the indicated value as received to an analog value and supply it to the deflection plate 6. A clock pulse generator 14 generates a clock pulse signal sequence having a predetermined period, a scan counter 15 counts the number of the clock pulses generated from the clock pulse generator 14 and sends the counted value via the switch SW to the digital to analog converter 13 so as to scan the electron beam 4, and a display deflection circuit 18 generates scanning sawtooth wave signals (horizontal and vertical) in synchrony with the clock pulses generated from the clock pulse generator 14, and drives a deflection coil 17b in a cathode ray tube display device 17. An intensity modulation circuit 16 amplifies the output signal of the secondary electron multiplier 10, that is, a video signal corresponding to the form of the surface of the wafer 9, and the output of the circuit 16 is supplied to a brightness modulation electrode of the display device 17.

Prior to the exposure of the resist layer by irradiating the pattern with an electron beam on the wafer 9, when the wafer 9 is positioned on the holder 8, a position error of about ±0.2 mm is caused. Next, the holder 8 and the wafer 9 are introduced into the sub-chamber 2. After exhausting the air (or other gas) in the sub-chamber 2, the holder 8 and the wafer 9 are introduced in the main chamber 1 and are positioned at a predetermined position. At this time, a position error of about ±0.3 mm may be caused. These errors result from errors in the shapes of the wafer 9 and the holder 8 and are also due to mechanical inaccuracy of the apparatus for introducing the wafer 9 and the holder 8 into the main chamber, and therefore these errors are not avoidable.

Therefore, in order to compensate for these errors, the shift or off-set of the position of the wafer 8 should be detected before the exposure pattern is irradiated with an electron beam on the wafer 9. First, the position of a mark having a predetermined shape and being arranged at a predetermined position on the wafer 9 (for example, a hollow portion etched by an etching process along a predetermined shape on the surface of the wafer 9) is detected as described below. The switch SW is connected to the scan counter 15 and a scanning signal is supplied to the deflection plates 6 so that a square region about 1 mm×1 mm on the wafer 9 is scanned by the electron beam 4. Of course, the center of the scanned square region coincides with the mark or has a predetermined relation to the mark if the above-mentioned errors do not exist.

The electron beam 4 which scans the square region passes over the mark, and when the electron beam passes over the mark, the number of secondary electrons detected by the secondary electron multiplier 10 varies, and this variation forms a brightness point on the display screen of the display device 17.

For example, a region 20 that is a scanning field on the wafer 9 as illustrated in FIG. 2A can be scanned with the electron beam 4. When a mark M is detected, a brightness point M' corresponding to the point M appears on a screen 17a of the display device 17 as illustrated in FIG. 2B. As the deflection plates 6 and the deflection coil 17b are driven by common clock pulses generated by the clock pulse generator 14, the position of the brightness point M' on the screen 17a corresponds exactly to the position of the mark M on the region 20.

Then, observing the brightness point M' on the screen 17a, an operator displaces the stage 7 by manual operation, so that the brightness point M' is displaced in the direction of an arrow 21 so as to coincide with the center C of the screen 17a.

After that, the switch SW is connected to the pattern control circuit 12 and a relatively small part of the region 20 in which the mark is positioned is scanned by the electron beam 4 along straight lines with a pitch of submicrons, and the variation of the reflected electron signal detected in the reflected electron detector 11 caused when the electron beam 4 passes over the mark M is sent via an amplifier and an analog to digital converter (not shown in FIG. 1) to a central processing unit CPU. When the central processing unit receives the output of the detector 11, the central processing unit compares the output of the reflected electron detector 11 with a command concerning the deflection position of the electron beam 4 supplied to the pattern control circuit 12, so that the positioning error of the mark M is precisely calculated.

However, the method for detecting the mark illustrated in FIG. 1 requires the display device 17 and the operation is carried out manually, and further, much time is required for detecting the position of the mark M.

Figure 3A:
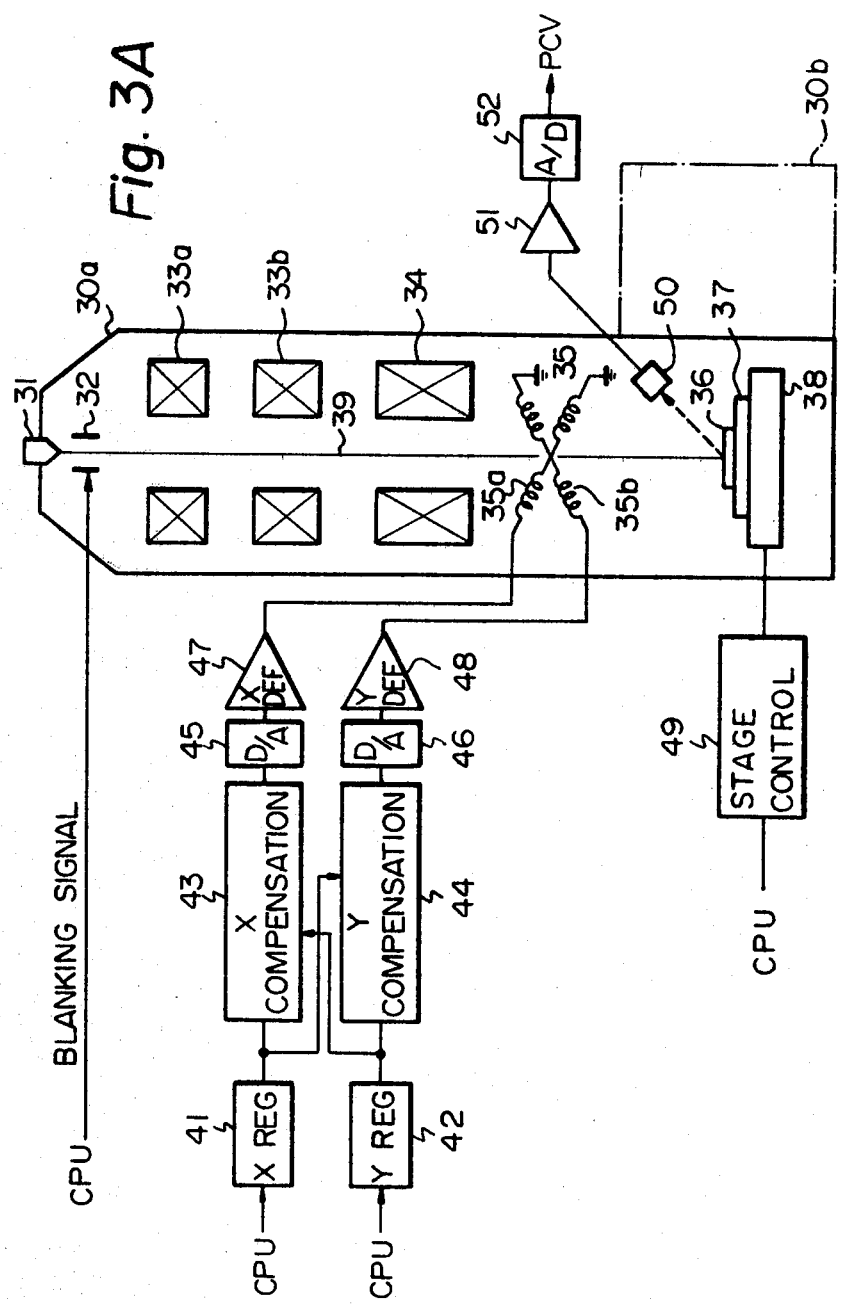
FIGS. 3A, 3B, 3C, 3D, 3E and 3F illustrate an electron beam exposure system for detecting the position of a wafer according to the present invention.

FIG. 3A illustrates a diagram of the system for detecting a position of a micro-mark on a substrate according to the present invention. Referring to FIG. 3A, 30a denotes a main chamber and 30b denotes a sub-chamber, 31 denotes an electron gun, and 32 denotes a blanker which receives a blanking signal from a CPU. 33a and 33b denote pairs of condenser lenses and 34 denotes a pair of objective lenses, 35 denotes deflection coils, 36 denotes a wafer, 37 denotes a holder, 38 denotes a stage, and 39 denotes an electron beam. An X-register 41 and a Y-register 42 receive data from the CPU, and the outputs of the registers 41 and 42 are supplied to an X-compensation circuit 43 and a Y-compensation circuit 44 as illustrated in FIG. 3A. The output of the X-compensation circuit 43 is supplied via a digital analog converter 45 and an X-deflection amplifier 47 to a deflection coil 35a. The output of the Y-compensation circuit 44 is supplied via a digital analog converter 46 and a Y-deflection amplifier 48 to a deflection coil 35b. Initially, the deflection data signals from the CPU are directly supplied to the digital analog converters 45 and 46 via registers 41 and 42. The position of the stage 38 is determined via a stage control 49 by a command of the CPU. Electrons reflected from the surface of the wafer 36 are detected by an electron detector 50 and the output of the detector 50, is amplified by an amplifier 51. After being converted into a digital signal by an analog to digital converter 52, the output of the amplifier 51 is sent to the CPU.

The position of the stage 38 is precisely detected by conventional measuring means such as a laser distance measuring device (not shown in FIG. 3A) which provides precise position data of the stage 38 to the CPU. When the wafer 36 mounted on the holder 37 is positioned at a predetermined position on the stage 38, the CPU automatically determines an origin (initial valve) of the wafer position, which may have a relatively large positioning error and then controls the position of the stage 38 on the basis of the origin. Next, the positioning error is corrected by the following steps using the compensation circuits 43 and 44.

Figure 3B:
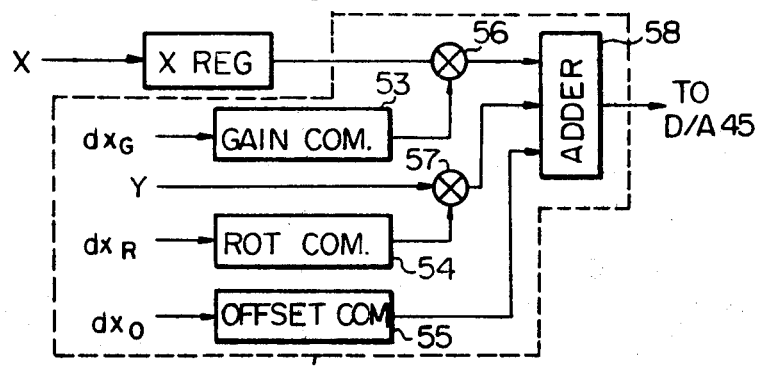

The X-compensation circuit 43 in FIG. 3A is constructed as illustrated in FIG. 3B. The X-compensation circuit 43 comprises a gain compensation device 53, a rotation compensation device 54, an offset compensation device 55, multipliers 56 and 57, and an adder 58. The output of the adder 58 is applied to the digital analog converter 45. The construction of the Y-compensation circuit 44 is substantially the same as that of the X-compensation circuit illustrated in FIG. 3B.

Figure 3C:
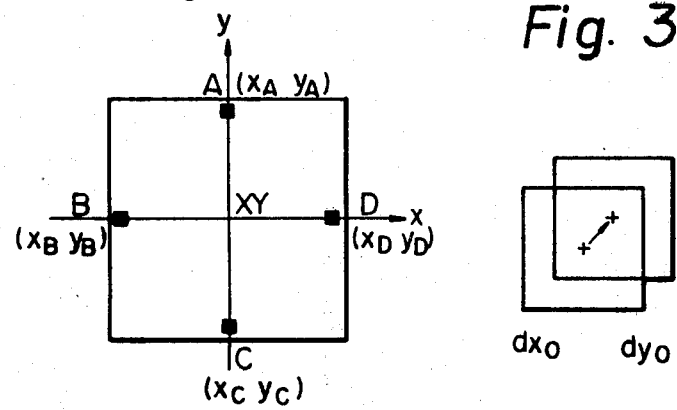
Figure 3D:
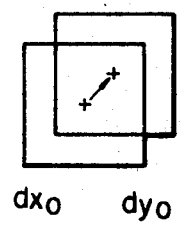
Figure 3E:
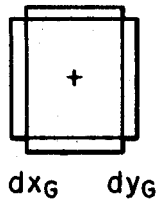
Figure 3F:
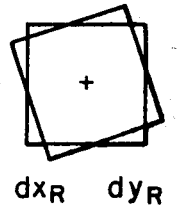

Below is a description of the offset compensation 55, the gain compensation 53 and the rotation compensation 54, with reference to FIGS. 3C, 3D, 3E and 3F. Offset, gain and rotation errors are determined by successively moving the stage 38 so as to approximately displace a mark on a wafer at each of predetermined four positions A, B, C and D in a scanning field on the axes of said scanning field as illustrated in FIG. 3C, and by detecting the coordinates of the mark for each position with respect to the aforementioned origin. Referring to FIG. 3C, axes x and y correspond to center axes of the scanning field. The coordinates (X, Y) corresponding to the center point of the scanning field shown in FIG. 3C are determined by the position of the stage 38 with respect to the origin of the wafer position. Accordingly, this coordinate (X, Y) may have relatively large offset errors $dx_0$ and $dy_0$ in comparison with that of the center point of the actual wafer area to be positioned in the scanning field. Offset errors $dx_0$ and $dy_0$ (see FIG. 3D) can be determined by the following equations.

$$dx_0 = \frac{x_A + x_C}{2} - x$$

$$dy_0 = \frac{y_B + y_D}{2} - y$$

(wherein $x_A$, $x_C$, $y_B$, $y_D$ are the actual detected coordinates of the mark when the mark is located near the respective positions A, B and D.)

Gain errors $dx_G$ and $dy_G$ (see FIG. 3E) due to the adjustment errors of the electron beam deflecting system are determined by the following equations.

$$dx_G = (x_D - x_B) - L_{BD}$$

$$dy_G = (y_A - y_C) - L_{AC}$$

(wherein $L_{BD}$ and $L_{AC}$ are correct distances between the positions B and C and between the positions A and C which are precisely detected by the aforementioned stage position measuring means (not shown in FIG. 3A)).

Rotation errors $dx_R$ and $dy_R$ (see FIG. 3F) due to the positioning error of the wafer can be determined by the following equations.

$$dx_R = (x_A - x_C)/L_{AC}$$

$$dy_R = (y_D - y_B)/L_{DB}$$

The CPU is programmed to automatically conduct all of the above steps including those of moving the stage to position the mark, scanning the mark with an electron beam to obtain position data of the mark by detecting its position, and calculating the above equations on the basis of the position data to obtain the offset, gain and rotation error values.

These offset, gain and rotation errors are supplied in the form of data signals from the CPU to the compensation circuits 43 and 44, which modify deflection data signals supplied thereafter from the CPU so as to compensate the errors.

In order to conduct such a position compensation operation as described above efficiently, a prompt detection of the precise position of the micro-mark must be done automatically. A particular object and feature of the present invention is to provide a method for detecting the precise position of the micro-mark wherein the electron beam 39 scans only along one or two straight lines in order to detect the mark.

In the present invention, a pilot mark, which has a predetermined position relative to a micro-mark formed on the wafer 36 and which is larger than the micro-mark formed on the wafer 36, is provided in the range where the electron beam 39 scans. Preferably, this pilot mark has a size comparable with the maximum positioning error of the wafer which may occur under the normal operation of loading the wafer into the electron beam exposure system. For example, as illustrated in FIG. 4A, a large pilot mark $PM_a$ having a square shape may be separately formed near a micro-mark $M_a$ for precisely determining the position of the wafer. Referring to FIG. 4A, first, an electron beam scans horizontally over the pilot mark $PM_a$ as illustrated in by reference numeral 60. This initial scanning position is determined by the CPU which provides initial scanning position data to the digital analog converters 45 and 46 via the registers 41 and 42 on the basis of a preset value representing the expected position of the pilot mark. In this operation, although the CPU determines the scanning position with respect to the origin of the wafer position which may involve said positioning error, the pilot mark is large enough to be passed across by the initially scanned electron beam. The detector 50 detects a reflected or secondary electron beam signal which varies abruptly when the electron beam passes over the peripheral portion of the pilot mark $PM_a$. The detected signals are supplied to the CPU (not shown), and two positions $X_{1a}$ and $X_{2a}$ on parallel sides of the periphery of the pilot mark $PM_a$ are read out by the CPU. Then, the pilot mark $PM_a$ is similarly scanned by an electron beam along the straight line 61 in a vertical direction, so that two positions $Y_{1a}$ and $Y_{2a}$ are supplied to the CPU and then are read out by the CPU. In the CPU, by using the values $X_{1a}$, $X_{2a}$, $Y_{1a}$ and $Y_{2a}$, the center position of the pilot mark $PM_a$ is calculated in the CPU according to the following equations.

$$X_{ma} = \frac{X_{1a} + X_{2a}}{2}$$

$$Y_{ma} = \frac{Y_{1a} + Y_{2a}}{2}$$

As the micro-mark $M_a$ is positioned at a predetermined position with respect to a center position $X_{ma}$, $Y_{ma}$ of the pilot mark $PM_a$, the position of the mark $M_a$ can be determined by the CPU from a horizontal distance $l_x$ and a vertical distance $l_y$. Then, an electron beam is scanned over the micro-mark $M_a$ in accordance with the command concerning the scanning position provided by the CPU and the position of the mark can be determined precisely.

For the purpose of precisely determining the position of the mark $M_a$, said mark $PM_a$ should be very small. Usually, the mark Ma is formed by a dent or a hollow made by an etching technique on the wafer. If a large mark is used, the ratio between the depth and the width of the mark becomes small and the sensitivity to detecting the edges of the mark decreases. Further, when the angular orientation of the mark $PM_a$ is incorrect as illustrated in FIG. 5, a detected center position P which is determined from values $X_1$, $X_2$ and $Y_1$, $Y_2$ does not coincide with the true center of the pilot mark $PM_a$. In FIG. 5, the x direction electron beam scanning line 30 and the y direction electron beam scanning line 40 correspond, for example, to the scan lines 60 and 61, respectively, in FIG. 4A. However, when the above equations for determining the center position of the properly oriented pilot $PM_a$ of FIG. 4A are applied to the angularly disoriented pilot mark of FIG. 5, the computed coordinates $X_m$ and $Y_m$ of the center position P are in error, viz:

$$X_m = \tfrac{1}{2}(X_1 + X_2)$$

$$Y_m = \tfrac{1}{2}(Y_1 + Y_2)$$

From these equations, it can also be seen that the extent of error of the detected center position of the mark $PM_a$ is proportional to the size of the mark $PM_a$.

In the initial step in which the position of the pilot mark $PM_a$ illustrated in FIG. 4A is read out, it is preferable to use a relatively large pitch for displacing the electron beam on the scanning line of the pilot mark which is larger than the size of the micro-mark so as to increase the scanning speed. For example, if the size of the micro-mark $M_a$ is from about 10 to 20 μm, and the size of the pilot mark $PM_a$ is about 1 mm×1 mm, a value of from 1 to several μm is used as the distance d of a series of electron beam spots $S_1, S_2, S_3, \ldots, S_n$ on a scanning line of the pilot mark $PM_a$ as illustrated in FIG. 6 and a value of about 0.1 μm is used as the distance between adjacent electron beam spots on a scanning line of micro-mark $M_a$. Further, for the purpose of decreasing the error due to a shift of the angle, the pilot mark $PM_a$ is positioned near the micro-mark $M_a$.

In the example illustrated in FIG. 4A, the pilot mark $PM_a$ is formed separately from micro-mark $M_a$. Alternatively, as illustrated in FIG. 4B, a pilot mark $PM_b$ is formed surrounding a micro-mark $M_b$. In reading the position of the micro-mark $M_b$, the outside periphery of the pilot mark $PM_b$ is read out similar to that of the example of FIG. 4A and the inside periphery defining the micro-mark Mb is read out similar to that of the micro-mark $M_a$ shown in FIG. 4A.

Further, a plurality of pilot marks $PM_{c1}$ and $PM_{c2}$ which are formed as straight lines and which are disposed to form a predetermined angle with respect to each other can be used as illustrated in FIG. 4C. In the example of FIG. 4C, the position of a micro-mark $M_c$ can be determined by scanning the electron beam along only one line which crosses the pilot marks $PM_{c1}$ and $PM_{c2}$. In FIG. 4D, a pilot mark $PM_d$ is formed by a great number of rectangular marks each having the same shape as a micro-mark $M_d$, which are arranged similar to a checkered patten. One of the marks arranged at the center of the pilot mark $PM_d$ can be used as the micro-mark $M_d$ for precisely determining the position of the wafer.

FIG. 4E illustrates another embodiment using a plurality of pilot marks, one set of which has a straight bar shape and each of a second set of which has a square shape. In FIG. 4E, four pilot marks $PM_{e1}$, $PM_{e2}$, $PM_{e3}$ and $PM_{e4}$ each of square shape have dimensions of 60μ×60μ each, and pilot marks $PM_{e5}$, $PM_{e6}$, $PM_{e7}$ and $PM_{e8}$ which have a bar shape each have dimensions of 670μ×10μ respectively. A micro-mark $M_e$ has dimensions of 15μ×15μ. In the pilot mark illustrated in FIG. 4E, first, an electron beam 63 scans horizontally along a straight line, thereby determining the position of a center point $X_{me}$ between the two crossing points. Then, the position of the pilot marks $PM_{e2}$ and $PM_{e4}$ is calculated with reference to the point $X_{me}$ and the distances between the points where the scanning line 63 crosses the pilot marks $PM_{e7}$ and $PM_{e8}$, and where the electron beam scans the pilot marks $PM_{e2}$ and $PM_{e4}$ is calculated so as to determine the precise position of the marks $PM_{e2}$ and $PM_{e4}$. After the determination of the position of the marks $PM_{e2}$ and $PM_{e4}$, the position of the micro-mark $M_e$ is determined as the center point between the marks $PM_{e2}$ and $PM_{e4}$. Then, the micro-mark $M_e$ is scanned by the electron beam in accordance with a command from the CPU which conducts the above calculation, and the actual center position of the micro-mark $M_e$ is precisely detected thereby to provide an accurate position data to the CPU.

The operation described above for detecting the accurate position of the micro-mark may be carried out at least for the initial position detection of the wafer after loading the wafer into the exposure apparatus. In the positioning error compensation process described with reference to FIG. 3A to FIG. 3F, the aforementioned operation for detecting the micro-mark position may be repeated to detect the precise mark position for each position A to D in FIG. 3C.

An example of exposure processing of a wafer in which the pilot marks illustrated in FIG. 4E are used in another manner will now be explained with reference to FIGS. 7A through 7C.

Referring to 7A, 71 denotes a wafer on which are formed position mark chips 72a, 72b and 72c the marks formed in said chips 72a, 72b and 72c correspond to the pilot mark and micro-mark illustrated in FIG. 4E), and a plurality of chips 73a, 73b, 73c, ... in which semiconductor devices are to be formed are arranged on the wafer 71. FIG. 7B illustrates one of the chips 73a, 73b, 73c, ... which is to be exposed seperately by an electron beam which can be scanned only within each one of the scanning fields 74a, 74b, ... 74n without moving the stage. FIG. 7C illustrates one such scanning field where patterns 75a, 75b are included. These scanning fields are limited to a relatively small size to assure the accuracy.

Exposure of the wafer 71 is carried out by the following process.

(a) The wafer 71 is introduced into the main chamber 30a via the sub-chamber 30b illustrated in FIG. 3A.

(b) In the main chamber 30a, the wafer 71 (which corresponds to the wafer 36 in FIG. 3A) is displaced by the movement of the stage 38 so that the scanning field is positioned over the position mark chip 72a (FIG. 7A), and the position of a micro-mark included in the position mark chip 72a is read out. Then, the wafer 71 is displaced to locate the scanning field over the position mark chip 72b, and the position of the micro-mark in the position mark chip 72b is read out. By using the positions of the micro-marks in each of the position mark chips 72a and 72b, the rotation angle of the wafer 71 is calculated to adjust the compensation circuits 43 and 44.

(c) After that, the wafer is displaced to locate the scanning field on a position of the center position mark chip 72c, where a gain adjustment of the electron beam is performed by detecting the mark therein. (see FIGS. 3C, 3D, 3E and 3F).

(d) Then, the wafer 71 is displaced to precisely locate the successive small scanning fields over a chip 73a, where initially the offset error is computed by using a position mark 76 (FIG. 7B) in the chip 73a which is detected to provide data signals for compensating the offset error to the compensation circuits 43 and 44.

(e) The chip 73a is then exposed from the fields 74a, 74b, ... to field 74n in individual sequence. The exposure pattern is determined by the CPU which reads out from a pattern data storage memory (not shown in the figures) data of predetermined patterns for one chip, and provides the data to the electron beam deflection system via the compensation circuits 43 and 44 successively.

(f) After the exposure operation is completed in the last field 74n for chip 73a, the exposure operation is performed in succession for the successive chips 73b, 73c, . . . .

The scanning of each of the successive chips 73a, 73b, 73c, ... in the respective, successive said scan fields, is performed by the following process, described below with reference to FIG. 7C.

(i) Data for starting points $X_0$ and $Y_0$ from the CPU are set in X and Y registers.

(ii) A blanking signal is turned off and electron beam radiation begins, so that a pattern 75a is scanned spot by spot in accordance with the data stored in the X and Y registers.

(iii) After the pattern 75a is completely scanned, the blanking signal is turned on, and the electron beam radiation is stopped.

(iv) Starting points $X_1$ and $Y_1$ of another pattern 75b are set in X and Y registers and the same processes (ii) and (iii) are repeated.

As mentioned above, according to the present invention, the position of a micro-mark can be read out by a few scanning operations under the control of a CPU without the manual operation which is necessary in a device with the display apparatus.

What is claimed is:

1. A method for detecting the position of a substrate utilizing a micro-mark on a substrate by detecting reflected electrons or secondary electrons radiated from said substrate when scanned by an electron beam, to determine a position where a predetermined exposure pattern should be formed by said electron beam into said substrate, the method comprising the steps of:

providing on said substrate a plurality of spaced-apart position mark chip areas and a plurality of device chip areas in which said predetermined exposure pattern is to be formed, each of said position mark chip areas being provided with a corresponding said micro-mark and at least one pilot mark which has a predetermined position relative to said micro-mark and is larger than said micro-mark, and each of said device chip areas being provided with a position mark, scanning one of said position mark chip areas by said electron beam so as to detect and read out the position of said pilot mark therein, determining the relative position of said read out position of said pilot mark with respect to said micro-mark so that the position of said micro-mark in said one of said position mark chip areas is determined, scanning said micro-mark in said one of said position mark chip areas by said electron beam so as to detect precisely the position of the same, repeating said scanning of said position mark chip area step, said relative position determining step, and said micro-mark scanning step on another of said position mark chip areas thereby to determine the exact position of said substrate and correspondingly the position of each said device chip area on said substrate where said predetermined exposure pattern should be formed, and scanning each device chip area to detect said position mark therein to establish precise alignment of said predetermined exposure pattern with the scanned said device chip area and exposing said device area in accordance with said exposure pattern, in individual succession for said plurality of device chip areas.

2. A method for detecting the position of a substrate having at least two position mark chip areas at respective and spaced-apart predetermined locations thereon, for enabling precise alignment of a predetermined exposure pattern with at least one device chip area of said substrate surface at a further, predetermined location thereon and on which a semiconductor element is to be formed in accordance with said predetermined exposure pattern, each said device chip area being provided with a position mark, comprising the steps of:

providing in each said position mark chip area at least one pilot mark and at least one micro-mark, each said micro-mark having a predetermined position relative to said pilot mark within said position mark chip area, said pilot mark being larger than said micro-mark, for said at least two position mark chip areas, in succession:

scanning the surface of said substrate with an electron beam and monitoring the resultant radiation from the surface of said substrate for detecting the position of said pilot mark of a corresponding said position mark chip area, computing the position of said micro-mark based on the detected position of said pilot mark and the known, predetermined position of said micro-mark relative to said pilot mark for the corresponding said position mark chip area, and scanning said substrate in accordance with the computed position of said micro-mark and monitoring the resultant radiation from the surface of said substrate for detecting the actual position of said micro-mark and thereby precisely defining the actual position of said micro-mark, and establishing precise alignment of said substrate in accordance with said detected and precisely defined actual positions of said micro-marks of said corresponding, at least two position mark chip areas, and determining the position of said at least one device chip area on which a semiconductor device is to be formed on the surface of said substrate in accordance with the established alignment of said substrate and the predetermined, known position of said device chip area relative to said precisely determined actual positions of said micro-marks of the corresponding said at least two position mark chip areas, and scanning each said device chip area in individual succession to detect said position mark therein and thereby to enable precise alignment of the predetermined exposure pattern with each said device chip area.

3. The method of claims 1 or 2, further comprising: providing said pilot mark as a square pattern and providing said micro-mark at a predetermined position relative to and displaced from said pilot mark within each said position mark chip area.

4. The method of claims 1 or 2, further comprising: providing said micro-mark at a predetermined position within the boundaries of said pilot mark in each said position mark chip area.

5. The method of claims 1 or 2, further comprising: providing plural said pilot marks in each said position mark chip area and defining each pilot mark in the configuration of plural, straight, elongated marks oriented along intersecting lines.

6. The method of claims 1 or 2, further comprising: defining each said pilot mark as a predetermined pattern of plural small marks, each said small mark of said pilot mark pattern being identical in configuration, and defining said micro-mark as a predetermined one of said small marks of said pilot mark pattern.

7. The method of claims 1 or 2, further comprising: defining said pilot mark as a pattern of four individual marks disposed at the corners of a square and four elongated marks oriented along the diagonals of the square and having a geometric intersection at the center of the square, each said elongated mark being of the same length and being displaced at its respective ends from an associated corner mark and said intersection, and defining a micro-mark precisely at said intersection, for each said position mark chip area.

8. The method of claims 1 or 2, further comprising: scanning the surface of said substrate by said electron beam in accordance with a first pitch for detecting of each said pilot mark and scanning the surface of said substrate by said electron beam in accordance with a second pitch for detecting each said micro-mark.

9. The method of claim 2 wherein the scanning of the surface of said substrate is performed by said electron beam in accordance with a first pitch for detection of said pilot mark and in accordance with a second pitch for detection of said micro-mark, said first pitch being larger than said second pitch.

10. The method as recited in claim 2 further comprising, establishing precise alignment of the predetermined exposure pattern with said at least one device chip area in accordance with said detected position mark thereof, and scanning the surface of said substrate in said device chip area in accordance with the predetermined exposure pattern.

11. The method as recited in claim 2 wherein said predetermined exposure pattern includes at least two scanning fields and each said device chip area includes at least one position mark located thereon to be in correspondence with the first of said at least two scanning fields, further comprising:

scanning the surface of said substrate with an electron beam and monitoring the resultant reflected radiation in accordance with the predetermined actual location of said at least one device chip area on said surface of said substrate for detecting said position mark therein, and scanning the surface of said substrate for said at least one device chip area with said electron beam in accordance with, and in succession for, each said scanning field of said exposure pattern.

12. A method as recited in claim 11 wherein each said substrate includes a plurality of said position mark chips and a plurality of said device chip areas to be exposed in accordance with a predetermined exposure pattern, further comprising:

scanning the surface of said substrate with an electron beam and monitoring the resultant reflected radiation to precisely determine the position of said micro-mark of each said mark position chip, in succession, and aligning the predetermined exposure pattern in a predetermined, individual succession with said plurality of device chip areas and, for each said device chip area, scanning same by said electron beam in accordance with, and in individual succession for, the plural scan fields of said aligned exposure pattern.

* * * * *

UNITED STATES PATENT AND TRADEMARK OFFICE
CERTIFICATE OF CORRECTION

PATENT NO. : 4,413,186

DATED : November 1, 1983

INVENTOR(S) : Kenyu Uema

It is certified that error appears in the above-identified patent and that said Letters Patent is hereby corrected as shown below:

Front page, Assistant Examiner, "Field" should be --Fields--.

Col. 4, line 53, after "50" insert --,--;

line 54, after "50" delete ",".

Col. 5, line 42, after "B" insert --, C--;

line 44, "adjutment" should be --adjustment--;

line 51, "C" should be --D--.

Col. 6, line 29, delete "in";

line 64, "1" should be --$\ell$--, first occurrence;

"1" should be --$\ell$--, second occurrence.

Col. 7, line 63, "patten" should be --pattern--.

*Col. 8, line 40, insert --(-- before "the".

UNITED STATES PATENT AND TRADEMARK OFFICE
CERTIFICATE OF CORRECTION

PATENT NO. : 4,413,186  Page 2 of 2
DATED : November 1, 1983
INVENTOR(S) : Kenyu Uema It is certified that error appears in the above-identified patent and that said Letters Patent is hereby corrected as shown below:

Col. 9, line 2, "on a position of" should be --over--;

line 12, "exposed" should be --exposed,--;

line 14, "CPU" should be --CPU,--.

Signed and Sealed this

Twentieth Day of March 1984

[SEAL]

Attest:

GERALD J. MOSSINGHOFF

Attesting Officer  Commissioner of Patents and Trademarks